(12) United States Patent
Matsumaru et al.

(10) Patent No.: US 8,357,935 B2
(45) Date of Patent: Jan. 22, 2013

(54) ELECTRONIC COMPONENT HAVING AN AUTHENTICATION PATTERN

(75) Inventors: Yasuhiro Matsumaru, Kanagawa (JP); Kenta Ogawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/137,247

(22) Filed: Aug. 1, 2011

(65) Prior Publication Data

US 2012/0043648 A1 Feb. 23, 2012

(30) Foreign Application Priority Data

Aug. 18, 2010 (JP) ................................. 2010-183363

(51) Int. Cl.
- H01L 23/58 (2006.01)
- H01L 29/10 (2006.01)
- H01L 23/544 (2006.01)
- H01L 21/66 (2006.01)
- H01L 21/76 (2006.01)
- H01L 21/00 (2006.01)
- G01R 31/26 (2006.01)

(52) U.S. Cl. .................. 257/48; 257/797; 257/E21.521; 257/E21.522; 438/14; 438/15; 438/18; 438/401; 438/462; 438/975

(58) Field of Classification Search .................... 257/48, 257/797, E21.521, E21.522; 438/14, 15, 438/18, 401, 462, 975
See application file for complete search history.

(56) References Cited

U.S. PATENT DOCUMENTS

| | | | | |
|---|---|---|---|---|
| 6,211,935 | B1 * | 4/2001 | Yamada | 349/149 |
| 6,593,156 | B2 * | 7/2003 | Nikawa | 438/17 |
| 6,680,220 | B2 * | 1/2004 | Minamio et al. | 438/110 |
| 6,987,868 | B1 * | 1/2006 | Atarashi et al. | 382/112 |
| 7,022,588 | B2 * | 4/2006 | Bosman et al. | 438/462 |
| 7,063,924 | B2 * | 6/2006 | Kaminsky et al. | 430/10 |
| 7,112,889 | B1 * | 9/2006 | Maruyama et al. | 257/797 |
| 7,164,195 | B2 * | 1/2007 | Furuya et al. | 257/693 |
| 7,883,985 | B2 * | 2/2011 | Matsui | 438/401 |
| 8,097,965 | B2 * | 1/2012 | Takata | 257/787 |
| 2009/0045360 | A1 * | 2/2009 | Wosnick et al. | 250/586 |
| 2010/0044858 | A1 * | 2/2010 | Cohn et al. | 257/734 |
| 2011/0124180 | A1 * | 5/2011 | Abe et al. | 438/462 |

FOREIGN PATENT DOCUMENTS

JP 2007-242973 9/2007

* cited by examiner

*Primary Examiner* — Ida M Soward
(74) *Attorney, Agent, or Firm* — McGinn IP Law Group PLLC

(57) ABSTRACT

In order to solve the above problem, provided is an electronic component having an authentication pattern formed on an exposed surface, in which the authentication pattern includes a base section including a resin and colored particles having a hue that can be identified in the base section, and the colored particles are dispersed so as to form dotted pattern in the base section.

10 Claims, 12 Drawing Sheets

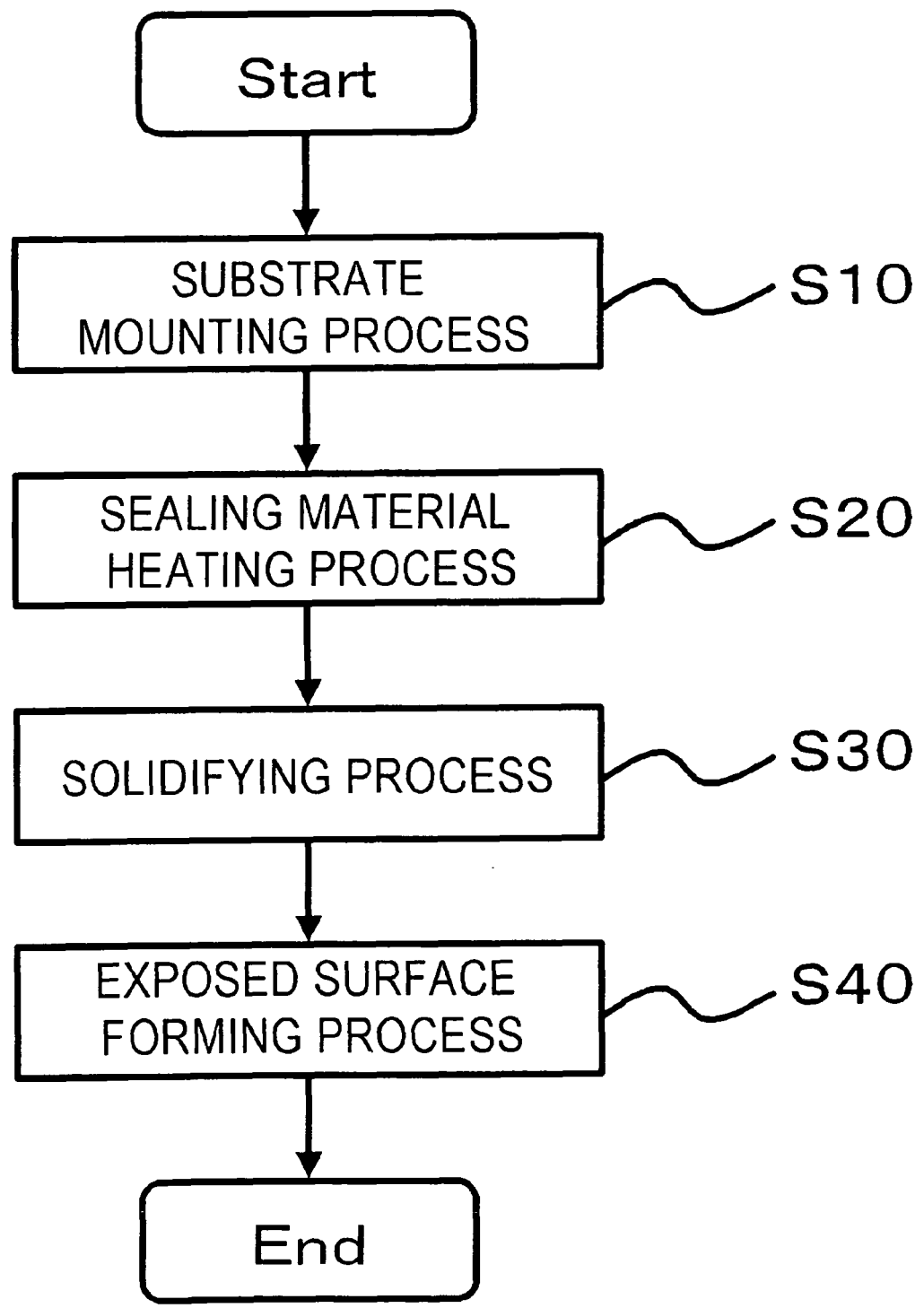

FIG. 4
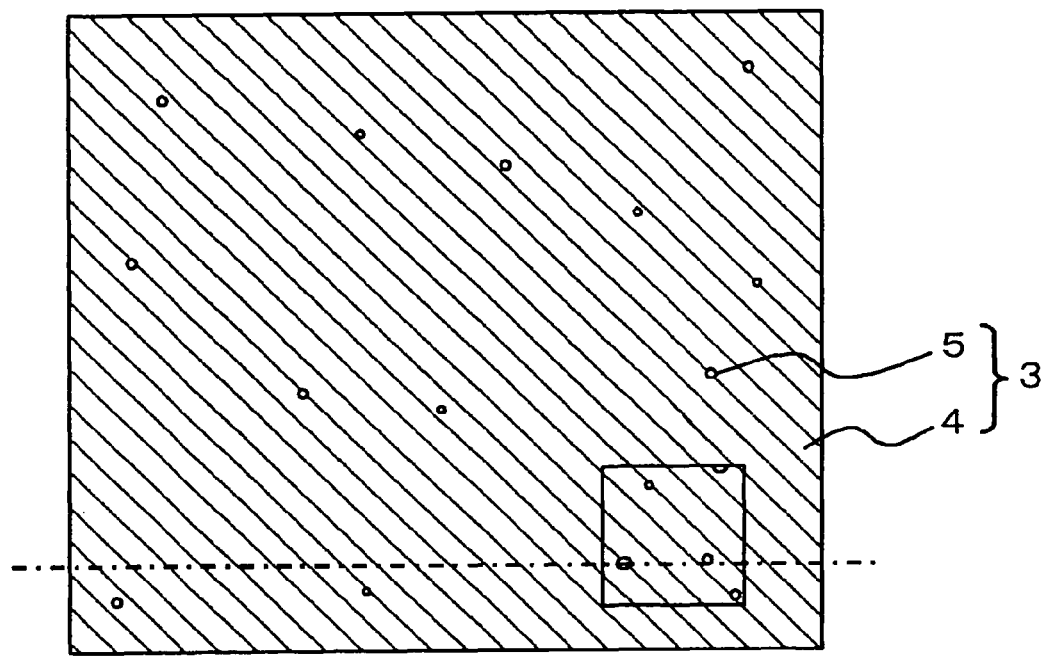
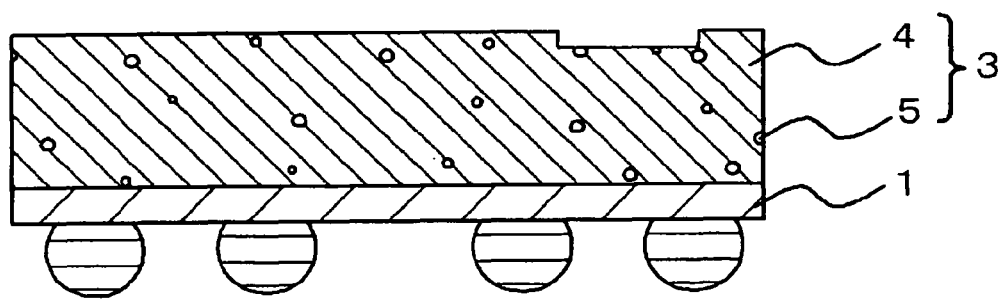

ELECTRONIC COMPONENT HAVING AN AUTHENTICATION PATTERN

This application is based on Japanese patent application No. 2010-183363, the content of which is incorporated hereinto by reference.

BACKGROUND

1. Technical Field

The invention relates to an electronic component and a method of manufacturing an electronic component.

2. Related Art

As entity authentication or a traceability technology of electronic components, such as a semiconductor device, there is a technology in which a naturally occurring pattern is used as authentication information as described in, for example, Japanese Unexamined Patent Publication No. 2007-242973.

Japanese Unexamined Patent Publication No. 2007-242973 describes a semiconductor device having a structure in which the semiconductor circuit is sealed with a sealing resin, and a unique mottled pattern is provided on the surface. In addition, as a method of manufacturing such a semiconductor device, the following manufacturing method is described. That is, it is described that two types of tablet (a first tablet having a first hue and a second tablet having a second hue) are alternately accommodated in a pot as a sealing material, and are pushed into the cavity of a split mold; while pushed into the cavity, the melt of the first tablet and the melt of the second tablet are mixed such that a flowing pattern occurs naturally, and flow into the cavity of the split mold; after that, the melts are solidified so that first sealing sections which are composed of the first tablet and have the first hue and second sealing sections which are composed of the second tablet and have the second hue form a mottled pattern on the sealed surface. Since the mottled pattern formed in the above manner is irregular, the mottled pattern is difficult to be forged and unique, and therefore it is possible to identify semiconductor devices respectively.

Meanwhile, it is described that, since a resin material has a high viscosity even when heated and thus melted, the melt of the first tablet and the melt of the second tablet are mixed, but are not homogeneously melted and mixed. In addition, as a method for differing the first hue and the second hue, a method is described in which different contents of carbon black are included in the respective tablets, or different pigments or dyes are mixed into the respective tablets.

SUMMARY

The technology described in Japanese Unexamined Patent Publication No. 2007-242973 has the following problems.

In the first sealing section composing a part of the mottled pattern, a color material having the first hue is dispersed at a predetermined density so that the first sealing section takes on a predetermined hue. In addition, in the second sealing section composing the other part of the mottled pattern, a color material having the second hue is dispersed at a predetermined density so that the second sealing section takes on a predetermined hue.

Here, when a first tablet and a second tablet are accommodated in a pot at the same time and are pushed into a mold at the same time so as to form mottled patterns like the technology described in Japanese Unexamined Patent Publication No. 2007-242973, it is considered that, in the vicinity of the border between a first sealing section and a second sealing section, a color material included in the first tablet and a color material included in the second tablet are mixed together. In such a case, it becomes difficult to identify the border between the first sealing section and the second sealing section. When such mottled patterns are used as an authentication pattern, since the accuracy of accurately identifying the mottled patterns is poor, as a result, there is a concern that the accuracy of authentication will become low.

In a first embodiment, there is provided an electronic component having an authentication pattern formed on exposed surfaces, in which the authentication pattern has a base section including a resin and colored particles having a hue that can be identified in the base section, and the colored particles are dispersed in the base section so as to form a dotted pattern.

In the electronic component of the invention, the dotted pattern composed of the colored particles dispersed in the base section is used as an authentication pattern. Therefore, there is no case in which it becomes difficult to identify the borders between the base section and the colored particles. As a result, it is possible to improve the accuracy of authentication.

In a second embodiment, there is provided a method of manufacturing an electronic component in which a resin including colored particles composing dots in a dot pattern that act as an authentication pattern is flowed and solidified on the electronic component, thereby fixing the colored particles.

In a third embodiment, there is provided a method of manufacturing an electronic component including a process in which an electronic component having a base section including a resin and colored particles having a hue that can be identified in the base section, in which the colored particles are dispersed so as to form dotted pattern in the base section is provided; a process in which the authentication pattern is photographed; and a process in which still image data of the photographed authentication pattern are saved.

According to the method of manufacturing an electronic component of the invention, it is possible to manufacture the electronic component of the invention as described above.

According to the invention, an electronic component having an authentication pattern which can be authenticated with a sufficient accuracy on an exposed surface is realized.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a flow chart showing an example of the method of manufacturing an electronic component according to the embodiments.

FIG. 4 is a view schematically showing an example of the electronic component according to the embodiments.

DETAILED DESCRIPTION

Figure 1A:
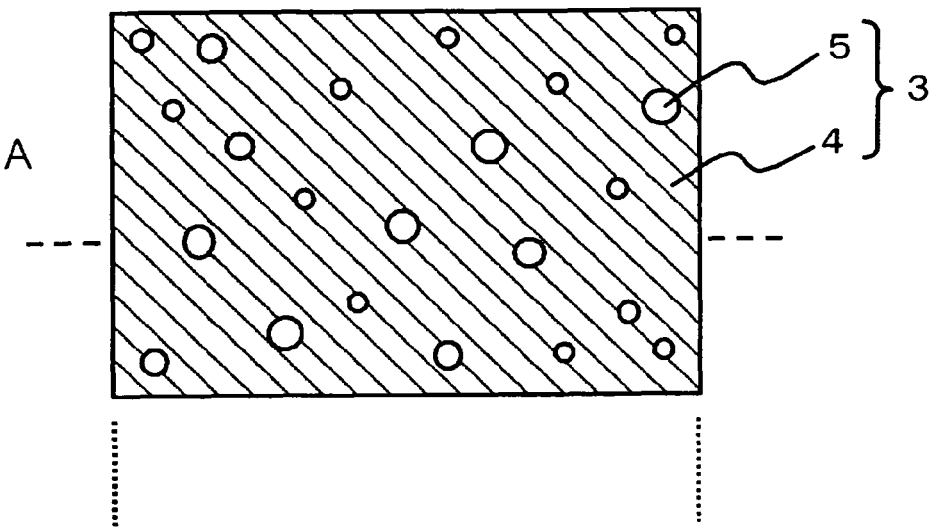
FIGS. 1A and 1B are views schematically showing an example of the electronic component according to the embodiments.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the invention will be described in detail with reference to the drawings. All of the following structural views schematically show the embodiments of the invention, and, unless otherwise described, the dimensions of the structure according to the invention are not specified by the scales of the components on the drawings. In addition, similar components are given similar reference numerals and will not be repeated.

<Embodiment 1>

Figure 1B:
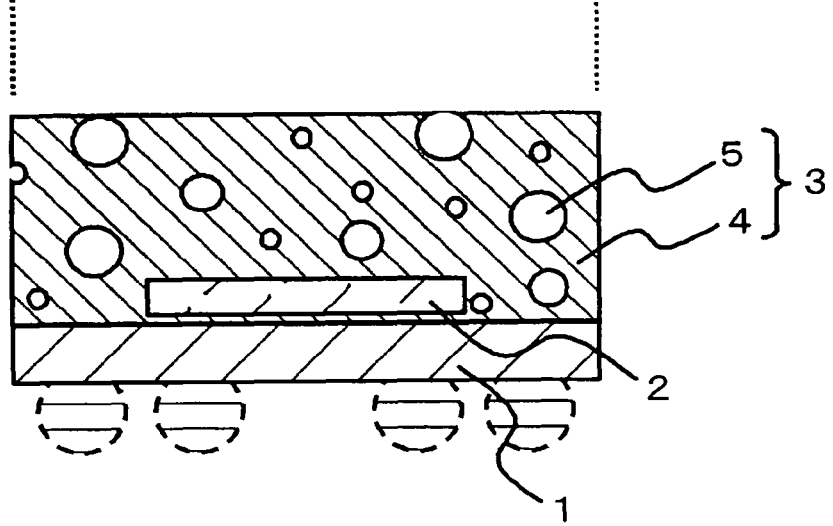

Using FIGS. 1A and 1B, the structure of the electronic component according to the present embodiment will be described. FIG. 1A is a plan view schematically showing the electronic component of the embodiment, and FIG. 1B is a cross-sectional view schematically showing the electronic component of the embodiment.

Firstly, an introduction to the electronic component according to the embodiment will be described.

The electronic component of the embodiment is a semiconductor device having a structure in which a semiconductor chip 2 mounted on a substrate 1 is sealed with a sealing material. In the example shown in the present drawing, the semiconductor chip 2 is mounted on the substrate 1 by a flip chip, but may be mounted using bonding wires. A sealing section 3 composed of a sealing material includes a base section 4 including a resin and colored particles 5 dispersed in the base section 4. Hereinafter, the material composing the sealing section 3 of the embodiment will be referred to simply as a "sealing material." The dispersion state of the colored particles 5 is naturally formed when the semiconductor chip is sealed, that is, when the sealing material in a molten state is injected to a predetermined location on the substrate 1. The colored particles 5 have a hue that can be identified in the base section 4 and form dotted pattern on the top surface (refer to FIG. 1A) of the sealing section 3. Meanwhile, the colored particles 5 may form dotted pattern on the side surfaces of the sealing section 3, although not shown.

The electronic component according to the embodiment has an authentication pattern formed on exposed surfaces (sealed surfaces) on the top surface and the side surfaces of the sealing section 3 composed of the sealing material. That is, the dotted pattern formed on the exposed surfaces (the sealed surfaces) on the top surface and the side surfaces of the sealing section 3 are used as the authentication pattern. Meanwhile, all of the exposed surfaces may be used as the authentication pattern, or a part of the exposed surfaces (for example, only the top surface, only one of the side surfaces, or only the top surface or a part of the side surfaces) may be used as the authentication pattern.

Next, the respective components composing the electronic component of the embodiment will be described.

The substrate 1 and the semiconductor chip 2 may have any configuration, and thus are not particularly limited. Therefore, the substrate 1 and the semiconductor chip 2 will not be described here.

The base section 4 can be composed of a material ordinarily used when the semiconductor chip is sealed (hereinafter referred to as an 'ordinary sealing material'). For example, the base section 4 may include (1) a base resin (an epoxy resin, an acryl resin, a polyamide resin, or other polymer resins), (2) a filler (silica or the like), (3) a color material (carbon black or the like), and (4) a variety of additives (a reaction speed controlling agent, an ion trapping agent, a component for improving the adhesiveness between a lead frame and a chip, or the like). Here, the base section 4 including the above materials (1) to (4) is simply an example, and the base section 4 may include other materials or may not include some of the materials (1) to (4). In addition, the above examples (in parentheses) of the materials (1) to (4) are simply examples, and thus any material can be used according to the related art. Meanwhile, the ordinary sealing material and the sealing material composing the sealing section 3 of the embodiment are differentiated by the inclusion of the colored particles 5 which will be described below.

The colored particles 5 are randomly dispersed in the base section 4 and have a hue that can be identified in the base section 4. That is, the colored particles 5 dispersed in the base section 4 form dotted pattern, and the dotted pattern are used as an authentication pattern.

Here, with regard to the dotted pattern formed by the colored particles 5, that is, the authentication pattern, it is desirable that the dispersion state of the colored particles 5 can be photographed by a camera for a process of authentication. Here, the photographing by a camera may be performed at the same magnification or at a predetermined magnification. However, considering the versatility, a configuration is desirable that can be photographed by a camera at a lower magnification. From such a viewpoint, the diameters of the colored particles 5 are desirably equal to or larger than 1 μm, and preferably equal to or larger than 10 μm. The presence or absence of dots having a large contrast difference from the peripheral sections can be visually determined when the diameters of the colored particles 5 are equal to or larger than 10 μm, which can significantly reduce limitation or obstacles for authentication. Removing the necessity of an exclusive device for an authentication process has an effect of increasing the frequency of authentication after products are distributed in markets, and thus makes it possible to significantly improve detection sensitivity when counterfeit products are distributed in markets. When the diameters of the particles are smaller than the above, it becomes difficult to identify the dispersion state of the colored particles 5 in dotted pattern, and thus photographing by a camera at a high magnification is required.

In addition, the diameters of the colored particles 5 are desirably equal to or smaller than 100 μm, and preferably equal to or smaller than 60 μm. The random dispersion state of the colored particles 5 is naturally formed when the semiconductor chip 2 is sealed with the sealing material, but, when the diameters of the colored particles 5 are larger than the above, there is a concern that it becomes difficult to obtain the random dispersion state of the colored particles 5.

Meanwhile, the diameters of the colored particles 5 may be substantially the same, or may be different. When the colored particles 5 having different diameters coexist in the base section 4, dots in a dot pattern formed on the sealed surfaces (the exposed surfaces) of the sealing section 3 become liable to have various sizes, and, consequently, the variation in the dotted pattern increases. That is, the number of variations of authentication patterns increases, and thus it becomes possible to apply the invention to embodiments in which authentication patterns are formed on a number of electronic components.

With respect to the above diameters of the particles, by setting the size of a region on which an authentication pattern is formed to equal to or larger than 2 mm$^2$, and preferably equal to or larger than 4 mm$^2$, it becomes possible to individually identify several millions of products. In addition, by setting the size of a region on which an authentication pattern is formed to equal to or smaller than 400 mm$^2$, it is possible to reduce a load in an authentication-related process, and, at the same time, to apply the invention to small-sized products.

Furthermore, the fraction of the colored particles (dots) present in a region in which an authentication pattern is formed (hereinafter referred to as a 'presence fraction') is desirably equal to or higher than 0.05 particles/mm$^2$, and preferably equal to or higher than 0.5 particles/mm$^2$. When the fraction becomes much less than the above, the amount of information that can be obtained from dotted pattern becomes small, and therefore it becomes difficult to use the colored particles 5 as authentication patterns for identifying a number of products. Here, the information that can be obtained from dotted pattern refers to information for identifying the respective dotted pattern (dotted pattern formed on the respective electronic components), that is, information for authentication, which can be considered as, for example, the number of dots, the positional relationships of a plurality of dots (example: information of a plurality of vectors indicating a positional relationship between two dots), the sizes or shapes observed from the respective dots, the colors of dots when the colored particles 5 include colored particles having a plurality of hues, or the like. Meanwhile, the series of information described here is simply an example, and information obtained from dotted pattern for authentication (authentication patterns) is not limited thereto.

Meanwhile, when the presence fraction is too high, it becomes difficult to detect differences among individual products particularly when the colored particles are observed at a low magnification, and therefore, by setting the presence fraction to equal to or lower than 3 particles/mm$^2$, and particularly equal to or lower than 1 particles/mm$^2$, it becomes possible to visually identify individual products with a certain degree or higher of accuracy. In addition, when the base resin includes a filler, such as silica, it is possible to obtain the same effect even by making the amount of colored particles added to the base resin (ratio by weight) smaller than that of the filler, thereby preventing the added amount from being excessive. In addition, by making the contrast difference of hues between the colored particle 5 and the base resin larger than that of hues between silica and the base resin, it is possible to obtain high visibility that is rarely affected by silica even in a resin including silica.

Here, as a unit which controls the presence fraction, for example, a unit which adjusts the content of the colored particles 5 in the sealing material can be considered. As another unit, a unit which performs control using the particle size distribution of the colored particles also can be considered. It is considered that, as the diameters of the particles decrease, or the fraction of particles having a small diameter increases, the presence fraction increases. Meanwhile, the presence fraction is desirably within a certain range of difference in the same product from the viewpoint of the difference in characteristics among individual products, but the presence fraction may be varied to a certain extent among regions in the same individual product. For example, when the surface of the sealing section 3 is divided into a plurality of sections having an area of 4 mm$^2$, if the difference in the presence fraction is equal to or higher than 20% among the sections in the same individual product, identification can be made using not only the positions or sizes of colored points, but also the number of colored points, and thus the data detection efficiency is significantly improved during an authentication process.

Next, the fraction of areas that are occupied by the colored particles 5 on the sealed surfaces (the exposed surfaces) in the sealing section 3 (hereinafter referred to as a 'coloration ratio') is desirably equal to or lower than 30%, preferably equal to or lower than 10%, and further preferably equal to or lower than 4%. When the areas occupied by the colored particles 5 in the sealed surfaces increase, there is a concern that characteristics (for example, endothermic characteristics during infrared heating) will vary locally on the sealed surfaces. Specifically, when the colored particles 5 gather densely in some regions, and the colored particles 5 are barely present in other regions, there is a concern that differences in characteristics (for example, endothermic characteristics during infrared heating) may occur among the regions. Therefore, the coloration ratio is desirably set to be in the above numeric range. Here, the coloration ratio can be controlled by adjusting the diameters and presence fraction of the colored particles 5.

Furthermore, the hues of the colored particles 5 are not particularly limited as long as the colored particles 5 can be identified in the base section 4, and any hue can be selected according to the hue of the base section 4. However, it is desirable to select a hue which makes the contrast difference with the hue of the base section 4 larger. By doing so, the identification properties of the colored particles 5 dispersed in the base section 4 are improved. For example, when the base section 4 is black, the colored particles 5 may be white. Here, the visible light reflectivity of the colored particles 5 is desirably larger than the visible light reflectivity of the base section 4. By doing so, it is possible to identify the colored particles 5 in the base section 4 with a high accuracy. When (lot numbers or the like) are marked on an authentication pattern (the exposed surfaces in the sealing section 3), it is desirable to determine the hues of the colored particles 5 in consideration of the color of the lot numbers or the like. Also, the colored particles 5 may include two or more of colored particles having different hues.

The colored particle 5 as described above may be a particulate substance including a resin (hereinafter referred to simply as 'particulate substance'), or may be a pigment. The particulate substance may include a color material, or may not include a color material when the resin has a desired hue. The particulate substance including a color material may be a substance formed by kneading a resin and the color material, or may be a particulate substance which is formed using a resin or inorganic substance and has a part or all of the surfaces coated with a layer including a color material. Here, the color material is not particularly limited as long as the color material has a desired required performance, such as a desired hue, or heat resistance high enough to tolerate heating in a sealing process, and it is possible to use any kind of color materials, such as a pigment or a dye (including a fluorescent dye).

Meanwhile, the particulate substance may include the same resin as the base resin (an epoxy resin, an acryl resin, a polyamide resin, or other polymer resins) included in the base section 4. By doing so, the particulate substance (the colored particles 5) and the base section 4 have similar specific gravities, and thus the particulate substance (the colored particles 5) becomes easily dispersed in the base section 4. In addition, the shape of the particulate substance may be not only spherical, but also columnar, such as cylindrical, or fibrous. In the case of any shapes other than spherical, the largest diameter is considered as the particle diameter. By doing so, the shapes of dots formed on the sealed surfaces (the exposed surfaces) in the sealing section 3 become diverse, and, consequently, the amount of information for authentication that can be obtained from the shapes of dots increases.

Here, the actions and effects of the electronic component according to the embodiment will be described.

(1) The electronic component of the embodiment has a structure in which the semiconductor chip 2 mounted on the substrate 1 is sealed with a sealing material, and the shapes of dots formed on the sealed surfaces (the exposed surfaces) when the semiconductor chip 2 is sealed are used as authentication patterns.

From the authentication patterns, it is possible to obtain the states of dots in the authentication patterns, that is, information of the number of dots, the positional relationships of a plurality of dots (example: information of a plurality of vectors indicating a positional relationship between two dots), the colors of dots when the colored particles 5 include colored particles having a plurality of hues, or the shapes of dots when the shapes of the colored particles 5 are cylindrical or the like, and it is possible to use one or more of the above pieces of information as authentication information. Since the states of dots are formed when the colored particles 5 are naturally dispersed in the base section 4 while the semiconductor chip 2 is sealed, the states vary with individual products. Therefore, it is possible to use the shapes of dots as authentication patterns. In addition, since it is difficult to artificially counterfeit such dot states, the authentication patterns are excellent in terms of counterfeit prevention.

(2) In addition, in the electronic component of the embodiment, it is possible to configure the colored particles 5 dispersed in the base section 4 in a manner that the colored particles can be identified in dotted pattern, for example, when the authentication patterns are photographed by a camera under predetermined photographing conditions. In such a case, since the borders are clear between the base section 4 and the colored particles 5, there is no case in which it becomes difficult to identify the borders with mottled patterns as in the technology described in Japanese Unexamined Patent Publication No. 2007-242973. That is, it is easy to accurately identify the authentication patterns. As a result, it is possible to improve the accuracy of authentication.

(3) In addition, when mottled patterns composed of first sealing sections and second sealing sections are formed on the sealed surfaces as in the technology described in Japanese Unexamined Patent Publication No. 2007-242973, there is a concern that the mottled patterns will cause differences in characteristics (for example, endothermic characteristics during infrared heating) among individual products.

Specifically, there is a concern that, due to the difference in hue between the first sealing section and the second sealing section, the endothermic characteristics will differ among regions occupied by the first sealing section, regions occupied by the second sealing sections, and regions in which the first sealing sections and the second sealing sections coexist. In such a case, there is a concern that temperatures will vary during the mount reflow of substrates among products having different dispersion states in the above regions, and thus poor joining is caused. In addition, even in the same product, due to the differences in the CTE and distribution between the first sealing section and the second sealing section, there is a concern that a difference in warped shapes may occur among individual products.

In contrast, according to the electronic component of the embodiment, by appropriately adjusting the diameters and presence fraction of the colored particles 5, it is possible to sufficiently reduce the fraction on the sealed surfaces (the exposed surfaces) in the sealing section 3, which are occupied by the colored particles 5 (the coloration ratio), while the colored particles 5 are secured in a state in which the colored particles 5 can be used as an authentication pattern. In addition, the colored particles 5 have a low chance of forming a continuous region in the base section 4, and instead the colored particles 5 form fine separate particles that are independently present in the base section 4. Therefore, variation in the positions in the base section 4 or the presence fraction in predetermined regions of the colored particles 5 do not cause any meaningful differences in handling a semiconductor device.

For example, even during heating in the substrate-mounting process of a semiconductor device, the absorption of heat by the semiconductor device occurs predominantly in the base section 4 that occupies the majority of the area, and the local influence of the colored particles 5 is equalized within a short time through thermal conduction since the region is small. In addition, when the entire sealed surfaces are considered, since the difference in the presence fraction of the colored particles is small among individual products, the amount of heat absorbed is almost the same among the individual semiconductor devices.

That is, according to the electronic component of the embodiment, it is possible to avoid the problem which may occur in the technology described in Japanese Unexamined Patent Publication No. 2007-242973.

(4) In addition, since the technology described in Japanese Unexamined Patent Publication No. 2007-242973 uses a plurality of resins having different colors and uses flowing patterns that are naturally formed when the resins are injected into cavities for authentication, there is a concern that individual products having the same conditions for the injection into cavities may include portions having reproducibility in the formed patterns.

While totally different patterns can be obtained from the respective cavities even in the same shot (a unit of ejection of a sealing resin) by preparing a sealing mold in which the distance between pot gates or the locations and shapes of gates vary with the individual cavities, there is no large difference in the flowing of the resin compared with patterns obtained from the same cavity in subsequent shots, and therefore patterns similar to the pattern formed in the previous shot (having commonality) are formed. In other words, the formed authentication pattern includes both patterns formed by fluctuation and patterns that can be artificially controlled.

Here, unlike an ID artificially provided, such as a two dimensional bar code (hereinafter referred to as an 'artificial ID'), authentication information using fluctuation (hereinafter referred to as a 'fluctuation ID') has a risk in that similar IDs may be generated accidentally. When patterns having reproducibility are used as described in Japanese Unexamined Patent Publication No. 2007-242973, the risk becomes large.

In addition, when patterns are obtained in a stricter manner and the amount of ID information is increased in order to reduce the risk, the increase of load cannot be ignored particularly in an authentication system of an electronic component for which it is necessary to perform a significantly large amount of identification.

Furthermore, individual product authentication information obtained from patterns including reproducibility (hereinafter referred to as an 'ID') may include information which is not necessary (cannot be used) for identification of individual products, which also increases the load of the authentication system. For example, when three feature points are picked up, from an obtained pattern for pattern matching, and one point of them is substantially a common point of a specific mother group (individual products manufactured from the same cavity), the point actually cannot be used for authentication. Despite the above fact, the information is included in the ID information such that authentication accuracy is impaired, or the number of feature points needs to be increased to make identification possible even in such a case, which results in an increase in the sizes of individual pieces of data.

In contrast, according to the electronic component of the embodiment, authentication patterns are formed using particles (colored particles), and therefore it is difficult to artificially control the locations or sizes of the respective colored particles in authentication patterns, and there is no reproducibility in the distribution.

When a region formed using the density of a plurality of particles or the like, such as a flowing shape, is used as an authentication unit, the authentication unit comes to include reproducibility due to the disposal of tablets in a resin pot or the shape of a mold as described above as in the related art, but the distribution of individual particles in an authentication region is rarely affected by the above factors and substantially cannot be controlled, and therefore it is possible to exclude portions having reproducibility from an authentication pattern.

(5) Meanwhile, the infrared ray absorption rate of the colored particles 5 is desirably smaller than that of the base section 4. With such a configuration, it is possible to suppress the influence of the distribution of the colored particles 5 during infrared heating.

(6) In addition, an authentication pattern may be formed by performing polishing, cutting, blasting, etching, a treatment using a laser, or the like on a part or all of the sealed surfaces (the exposed surfaces) after sealing (after curing the base resin) so as to remove a surface layer. In a sealed state, the colored particles 5 are not exposed only at points that are brought into contact with the mold; however, by removing the sealed surfaces (the exposed surfaces) after sealing at least as thick as about a tenth, and preferably a fifth or more of the largest diameter of the colored particles 5, it is possible to increase the possibility of exposing the colored particles 5 from the sealed surfaces. In a case in which this unit is used, even when the content of the colored particles 5 is decreased in the sealing material, it is possible to obtain an authentication pattern having a sufficient amount of authentication information. There is no upper limit of the depth of removal as long as the depth is not larger than a depth in which the colored particles 5 are dispersed, but removal of more than is necessary causes variation in retroflexion behaviors, and therefore the upper limit of the depth of removal is preferably equal to or smaller than 100 times, and preferably equal to or smaller than 10 times the largest diameter of the colored particles 5.

(7) In addition, when an authentication pattern is obtained by polishing the sealed surfaces (the exposed surfaces) after sealing, the diameter of the cross-sectional shape and shape of the colored particle become diverse on the exposed surfaces, and, consequently, it is possible to increase authentication information.

(8) Furthermore, when an authentication pattern is obtained by polishing the sealed surfaces (the exposed surfaces) after sealing, the radiuses of curvature of the exposed colored particles 5 become larger than the radiuses of curvature of the non-exposed colored particles 5. By increasing the flatness of the authentication patterns exposed on the surfaces, it is possible to obtain a higher accuracy of authentication.

(9) Meanwhile, when "a part" of the sealed surfaces (the exposed surfaces) is used as an authentication pattern, the electronic component of the embodiment may have information for specifying the authentication pattern present in the sealed surfaces (the exposed surfaces) (hereinafter referred to as an 'alignment mark') attached to the sealed surfaces (the exposed surfaces). Specific examples of the alignment mark are not particularly limited, and may be, for example, a frame surrounding a predetermined region or a mark (a mark, such as an 'L' letter or a 'cross' mark) for specifying a predetermined region. Attaching such an alignment mark can efficiently specify the authentication pattern, and, consequently, it is possible to obtain an authentication pattern or perform an authentication process efficiently with a few facilities and little storage load. Meanwhile, the alignment mark may be formed by a unit, such as laser marking or printing, which provides protrusions and recesses to a mold when a resin is sealed. The alignment mark may be formed in the same region as the region where the authentication pattern is located and may be formed higher than the surface of the authentication pattern. In such a configuration, by making the regions in which the authentication pattern and the alignment mark are formed to form recessed portions, it is possible to use the alignment mark as a protective section of the authentication pattern.

(10) In addition, the electronic component of the embodiment may have a mark on the sealed surfaces (the exposed surfaces). Authentication is possible in a state in which the marked region is masked or even when the marked region is included. Furthermore, it is also possible to use the mark as the alignment mark. The embodiment also has a feature that, when a mark is present on the surfaces of the semiconductor device, the visibility of the marked region is excellent in comparison to the technology described in Japanese Unexamined Patent Publication No. 2007-242973.

(11) Meanwhile, the embodiment is not limited to an embodiment in which dotted pattern are formed on sealed surfaces having a ball grid array (BGA) and are used as an authentication pattern, and can be an embodiment in which dotted pattern are formed on sealed surfaces having a quad flat package (QFP) or the like and are used as an authentication pattern. In addition, dotted pattern may be formed on a solder resist layer in a wiring substrate or a protective film on the surface of a chip. In the case of a pattern using natural fluctuation, it is possible to form an almost limitless number of pieces of authentication information even in the same manufacturing formulation, and a special process is not required.

(12) In addition, since the embodiment has an authentication pattern (dotted pattern) on the exposed surfaces of the electronic component, workability for optical authentication is excellent. In addition, since the authentication pattern is present at an easily viewable place, it is easy to detect a counterfeit when a product is counterfeited.

(13) Furthermore, in the embodiment, since dotted pattern formed on a part of the electronic component, which play a predetermined role (for example, the sealing section that plays a role of sealing the semiconductor chip), are used as an authentication pattern, it is difficult to destroy the authentication pattern without losing a function of the electronic component. That is, when the authentication pattern is destroyed, there is a possibility of losing the function of a part of the electronic component. Therefore, an effect is expected in which behaviors destroying the authentication pattern are suppressed, and thus security properties are improved. Particularly, when a resin composing the authentication pattern is in direct contact with a functional section, such as a chip or wires, or a functional section is pinched by a resin composing the authentication pattern from two or more directions, it becomes difficult to destroy or replace the authentication pattern while the functions of the functional section are maintained.

(14) In addition, by combining authentication information, such as a chip, a substrate, or a sealing resin, it is possible to build comprehensive traceability from the assembly to shipment of a semiconductor or traceability information including the combination information of the respective component members.

(15) Furthermore, since dotted pattern formed on the sealed surfaces are used as an authentication pattern, an authentication pattern can be formed simply by changing a material used in the sealing process, which can reduce costs and suppress the number of processes to the minimum.

(16) In addition, since it is difficult for an authenticator to detect whether the authentication pattern is a controllable reproduced pattern or a pattern formed using natural fluctuation, there is a risk in which a product having a reproduced pattern may be determined as the same product when the pattern includes a similar feature section of an irregular shape. The same thing can apply to a system, and, when a similar pattern (for example, patterns in products formed from the same cavity) and a pattern having no reproducibility (patterns in products formed from different cavities) coexist, if the difference between the former and the latter is used as a criterion, there is an increasing risk in which separate individual products, which fall in the former case, may be misidentified as the same product. When the difference between the former and the former is used as a criterion, authentication efficiency is reduced. When the difference is the distribution of particles, the variation in the difference between individual products is small, and thus it is possible to minimize this type of misidentification risk or efficiency reduction.

(17) In addition, since the authentication pattern is individual particles dispersed, there is no regularity and reproducibility. In a case in which the authentication pattern includes, for example, reproducibility due to the sealing cavity or the resin array as in Japanese Unexamined Patent Publication No. 2007-242973, there is an increasing risk in which products are identified as the same product due to features in the reproduced pattern even when there are differences in the patterns of other portions, but it is possible to suppress the risk by excluding the reproducibility.

(18) Particularly, it is preferable to include colored particles having a particle diameter of 10 µm to 100 µm in a resin layer and to adjust the amount of the colored particles 5 added so as to form regions on the authentication surfaces of the resin layer, in which dot patterns composed of the colored particles 5 are observed with a density of 0.05 particles/mm$^2$ to 3 particles/mm$^2$.

Even when the area of the authentication regions is suppressed to be relatively small, it is possible to sufficiently secure the number of variations in random patterns generated by reducing the particle diameters of the colored particles 5 and dot patterns generated from the colored particles 5; however, on the other hand, from the viewpoint of authentication load or data amount, the observation resolution (the number of pixels) is desirably a certain level or lower, and it is not preferable to extremely reduce the area per pixel. At this time, as the density of dot patterns increases, the possibility of including a plurality of dot patterns in one pixel increases, and thus'analog determination using the number of dot patterns included becomes necessary, which may cause the degradation of authentication accuracy. Therefore, with regard to the diameters of the colored particles 5, it is possible to preferably satisfy both the diversity of patterns (the number of variations in random patterns) and authentication accuracy by adjusting the amount of the colored particles 5 added so as to form regions on the authentication surfaces of the resin layer, in which dot patterns composed of the colored particles 5 are observed with a density of 0.05 particles/mm$^2$ to 3 particles/mm$^2$.

Next, an example of the method of manufacturing the electronic component of the embodiment will be described using the flow chart of FIG. 2. Meanwhile, the manufacturing method described here is simply an example, and the electronic components of the embodiment are not limited to components manufactured by the above manufacturing method.

As shown in FIG. 2, the method of manufacturing the electronic component according to the embodiment includes a substrate mounting process S10, a sealing material heating process S20, and a solidifying process S30. Here, the method may further include an exposed surface forming process S40.

In the substrate mounting process S10, a substrate 1 having a plurality of semiconductor chips 2 mounted thereon is mounted in a sealing mold. This process can be realized according to the related art.

The sealing material heating process S20 is performed after the substrate mounting process S10, in which a sealing material including a sealing resin and colored particles 5, which is injected in a pot, is heated. Here, the type of the sealing resin is not particularly limited, and it is possible to use a resin that is used as the base resin of an ordinary sealing material, such as an epoxy resin. The sealing material may further include a filler (silica or the like), a color material (carbon black), and a variety of additives (a reaction speed controlling agent, an ion trapping agent, a component for improving the adhesiveness between a lead frame and a chip, or the like).

Meanwhile, the heating in the sealing material heating process S20 is performed under a condition in which the sealing resin is melted, but the colored particles 5 are not melted. Such a condition can be realized by the adjustment of heating temperatures or the design of the colored particles 5. As the design of the colored particles 5 which satisfies the condition in which the sealing resin is melted, but the colored particles 5 are not melted, a design in which a material having a higher melting point than the sealing temperature (about 230° C.) is selected as a resin included in the colored particles 5, or, even when the resin is the same type of resin as the base resin, colored particles 5 including a thermosetting resin which is more cured than the base resin is used can be considered.

The solidifying process S30 is performed after the sealing material heating process S20, in which the heated and thus melted substance is flowed by pressure and solidified in the sealing mold in which the substrate 1 having the semiconductor chips mounted thereon is mounted. Thereby, the semiconductor chips 2 are sealed, and, at the same time, dotted pattern are formed on the sealed surfaces (the exposed surfaces) of the sealing section 3.

The exposed surface forming process S40 is performed after the solidifying process S30, in which the exposed surfaces of a solidified substance of the molten substance (sealing section 3) are removed, and second exposed surfaces composed of the solidified substance (the sealing section 3) are formed. A unit which removes the exposed surfaces is not particularly limited, and it is possible to use a unit, such as polishing, cutting, blasting, or etching. By undergoing the process, it is possible to use the second exposed surfaces which have been obtained by removing the exposed surfaces as an authentication pattern. In such a case, the probability of the colored particles 5 being present in the sealed surfaces (the exposed surfaces) of the sealing section 3 increases, and the diameters of the surface shapes or the shapes of the colored particles 5 in the sealed surfaces (the exposed surfaces) become diverse. That is, the probability of the colored particles 5 being present in an authentication pattern increases, and the diameters of the surface shapes or the shapes of the colored particles 5 in the authentication pattern become diverse. As a result, it is possible to increase the amount of information that can be obtained from the authentication pattern.

Meanwhile, the method may further include a process in which the second exposed surfaces are selectively removed, and protrusions and recesses are formed on the second exposed surfaces after the exposed surface forming process S40. The process can be realized by a unit in which a laser is scanned on predetermined locations on the second exposed surfaces, or the like. The process can also be performed after the solidifying process S30. In such a case, it is desirable not to perform the exposed surface forming process S40.

After that, the substrate 1 is individualized to have one of the semiconductor chips 2 per piece.

As such, according to the method of manufacturing the electronic component of the embodiment, it is possible to manufacture an electronic component having as excellent actions and effects as described above.

Next, an example of the method of manufacturing the electronic component of the embodiment will be described in detail.

First of all, a process in which a sealing material is prepared will be described.

As the colored particle 5, a particulate substance obtained by kneading a white pigment (for example, a compound of an oxide or the like of Ti, Sr, Zn, Pb, Cd, or the like) in an epoxy resin, and then making the epoxy resin perform a curing reaction is prepared. Since the pigment is a compound of an oxide or the like, the pigment is relatively stable, and, since the pigment is sealed in a resin, it is possible to obtain insulation properties and suppress ion migration or the like even in an electric field. The resin composing the particulate substance is not limited to an epoxy resin, and may be, for example, a resin, such as acryl or polyimide, or an inorganic material, such as silica, having the surfaces coated with a color layer. The shape of the colored particle 5 is not particularly limited, and may be substantially spherical. By doing so, it is possible to secure fluidity when the colored particles are sealed. For example, the colored particles 5 are formed into spherical shapes having different sizes by being cured in air or a liquid, and then are passed through a sieve having a predetermined mesh size, thereby obtaining predetermined size and shape. Diverse shapes may be obtained by destroying the colored particles after being formed into spherical shapes.

Next, a sealing material (table-shaped) including a desired volume ratio (for example, about 5%) of the colored particles 5 is formed. The sealing material includes, in addition to the colored particles 5, an epoxy-based sealing resin (an epoxy component before the completion of the curing reaction) as the base resin, silica ($SiO_2$) filler, carbon black, other additives, or the like. The formation of the sealing material (tablet-shaped) can be realized according to the related art, for example, by kneading the material and then making the material into powder and tablets (forming into a tablet shape). Even if the distribution of the colored particles 5 is biased due to the difference in specific gravity or particle diameter during the kneading, since the material is made into powder (the colored particles 5 are fixed in each of powders) and then tableted after the kneading, the colored particles are almost evenly distributed in a completed resin tablet at a macroscopic level.

Next, a process in which the semiconductor chips 2 are sealed using the sealing material will be described.

First of all, a plurality of semiconductor chips 2 is mounted on the substrate 1 (a BGA substrate), the electrodes of the substrate 1 and the semiconductor chips 2 are connected through wires or the like, and then the substrate 1 on which the semiconductor chips 2 are mounted is mounted in a sealing mold. Next, the tablet-shaped sealing material is injected and then heated in a resin pot in the sealing mold so that the resin component (the base resin) becomes a molten substance having viscosity. After that, pressure is applied to the pot so that the molten substance is flowed into cavities formed by the mold at regions on the semiconductor chips 2. Since the molten substance has a certain level of viscosity and is stirred by the flow when the molten substance is flowed in, the colored particles 5 included in the molten substance are dispersed randomly. Therefore, the distribution of the colored particles 5 in the sealing material formed on the semiconductor chips 2 varies with each of the semiconductor chips 2 (each of individual products) even if the semiconductor chips 2 are present on the same substrate 1.

After that, a thermal treatment is performed so as to proceed with the curing reaction of the epoxy component in the base resin, thereby solidifying the sealing material. That is, the colored particles 5 are fully fixed.

At this time, a part of the colored particles 5 is fixed in a state in which the colored particles 5 are in contact with the mold, and thus become exposed on the surfaces of the sealing section 3 composed of the sealing material after the substance is taken out from the mold. Alternatively, the colored particles 5 are thinly coated with a base resin layer. In such a state, there are cases in which the colored particles 5 can be seen through.

Meanwhile, it is not necessary to vary the sealing condition for each of individual products, and, even when the sealing work is performed continuously under the same condition, the random distribution of the colored particles 5 can be obtained in each of the individual products by the actions of natural fluctuation, such as the slight difference in the distribution of the colored particles 5 in the original tablets or the disarray of the flow in the sealing mold thereafter. The fact that it is not necessary to change the manufacturing conditions in order to provide different authentication information is an extremely large advantage in the manufacture of semiconductor devices in which a large number of the same products are manufactured.

After an electronic component having an authentication pattern formed therein, which includes a base section 4 including a resin and the colored particles 5 having a hue that can be identified in the base section 4, and in which the colored particles 5 are dispersed in the base section 3 so as to form dotted pattern, is prepared, the authentication pattern present in a part or all of the exposed surfaces is photographed at a predetermined magnification. For example, the authentication pattern is photographed using an image obtaining section composed of a camera equipped with an optical system, such as a CCD, a CMOS sensor, or a lens. Meanwhile, the photographing may be performed before the substrate is individualized. In such a case, the photographing may be performed on the region of each of individual semiconductor products (the region to be individualized in a post process) or on a plurality of products (for example, on one piece of the substrate) at the same time, and then the obtained photographing data are separated into data for each of the individual products. In the latter case, the position information in the substrate is obtained at the same time, which is thus preferable for traceability.

After that, the obtained photographing data or codes generated from the data are saved in a server as the authentication information of the electronic component. In addition, product information (a product name, a lot number, or process history information) may be matched to the authentication information and then be saved in the server.

Meanwhile, the photographing and saving in the sever of the authentication pattern may be performed by manufacturers of electronic components as a part of the process of manufacturing an electronic component. Alternately, authenticators who are not manufacturers of electronic components may obtain an electronic component having an authentication pattern formed therein and then perform the photographing and saving in a server of the authentication pattern.

After that, by a method, such as providing the photographing data (or the codes) to an authenticator so that the authenticator compares the photographing data and the pattern of an individual product to be authenticated or by comparing the photographing data obtained from an individual product to be determined with the photographing data saved in the server, it is possible to specify whether the individual product is a genuine product (authentication of an individual product) or to specify how the individual product to be determined has been manufactured (traceability) even for electronic components which have already been distributed commercially.

<Embodiment 2>

The electronic component of the present embodiment has a difference of forming protrusions and recesses on the exposed surfaces of the sealing section 3 in the electronic component of Embodiment 1.

Figure 3:
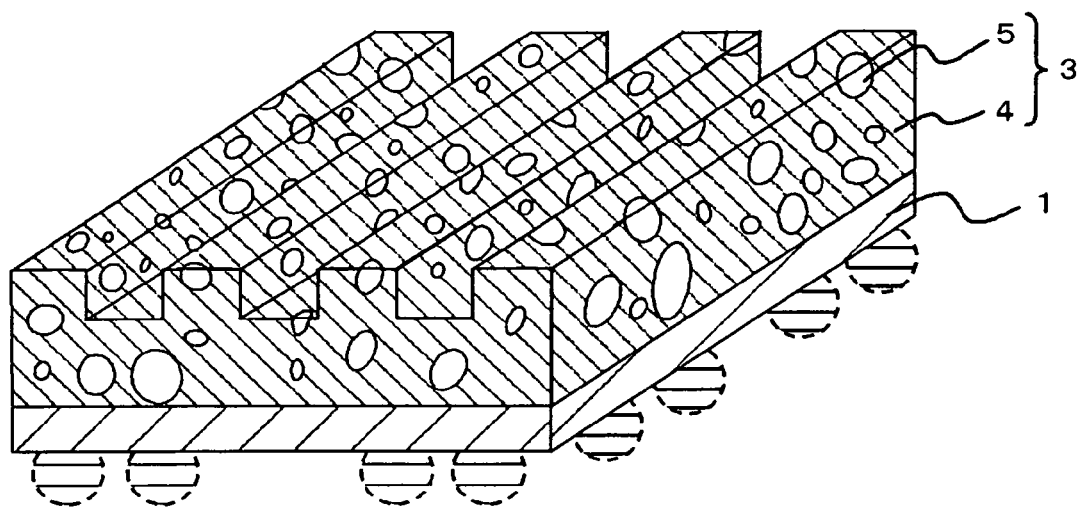
FIG. 3 is a view schematically showing an example of the electronic component according to the embodiments.

FIG. 3 is a perspective view schematically showing an example of the electronic component of the embodiment. The electronic component shown in the drawing has protrusions and recesses formed in a manner that the protrusions and the recesses draw parallel lines with a predetermined pitch. By having such a configuration, in addition to the actions and effects as described in Embodiment 1, it is possible to increase dotted pattern that can be used as authentication patterns, and it becomes difficult to make a counterfeit.

FIG. 4 shows another example of the electronic component of the embodiment. FIG. 4A is a plan view schematically showing an example of the electronic component of the embodiment, and FIG. 4B is a cross-sectional view schematically showing an example of the electronic component of the embodiment. The example shown in FIG. 4 has a difference of having a protrusion and recess shape compared to the example shown in FIG. 3.

Meanwhile, the protrusion and recess shown in FIGS. 3 and 4 is simply an example, and thus the protrusion and recess included in the electronic component of the embodiment may have other shapes.

Here, using FIGS. 5 to 8, units which form the protrusion and recess and the configuration of the protrusion and recess formed using each of the units will be described. FIGS. 5 to 8 are cross-sectional views schematically showing a part of an example of the electronic component of the embodiment.

Figure 5:
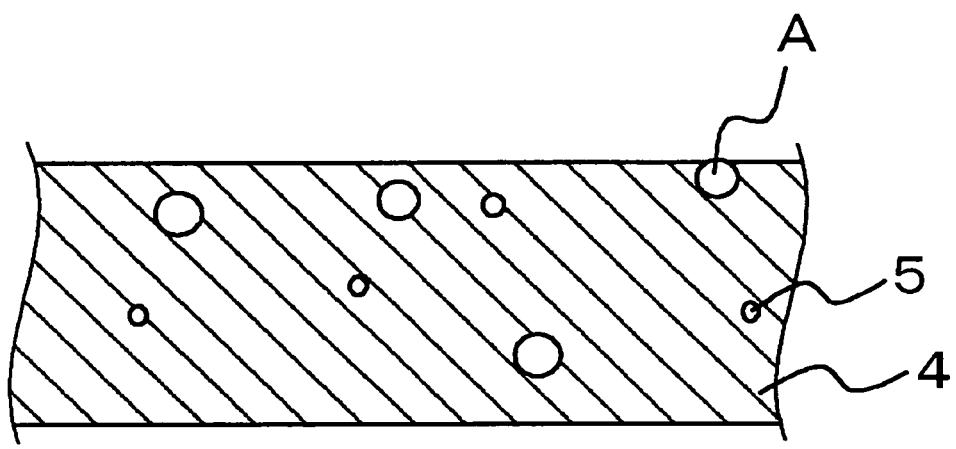
FIG. 5 is a view schematically showing an example of a part of the electronic component according to the embodiments.

FIG. 5 is a view showing the appearance of an electronic component before a recessed portion is formed. Here, the colored particle 5 indicated by the sign of 'A' shows a colored particle 5 observed when the surface of the electronic component in the state of the drawing is observed (observed in the top to down direction in the drawing).

Figure 6:
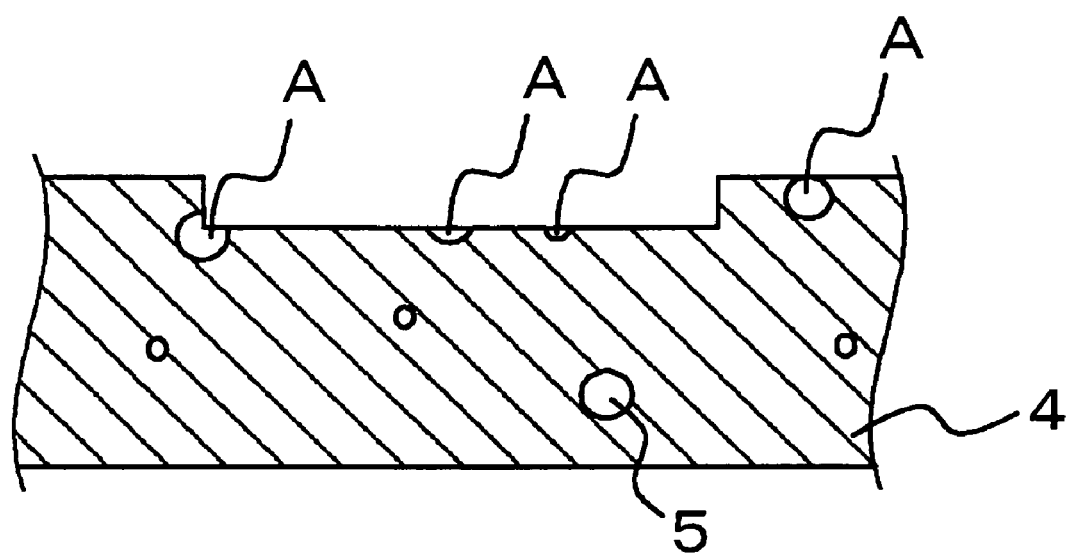
FIG. 6 is a view schematically showing an example of a part of the electronic component according to the embodiments.

FIG. 6 is a view showing an appearance in which a recessed portion is formed on the electronic component in the state of FIG. 5 using a mechanical forming unit, such as a slicing process. In the case of the electronic component in the present drawing, it becomes possible to observe colored particles 5 that could not be observed in the state of FIG. 5. That is, the number of dots composing dotted pattern on the surfaces of the electronic component is increased by forming a recessed portion.

Figure 7:
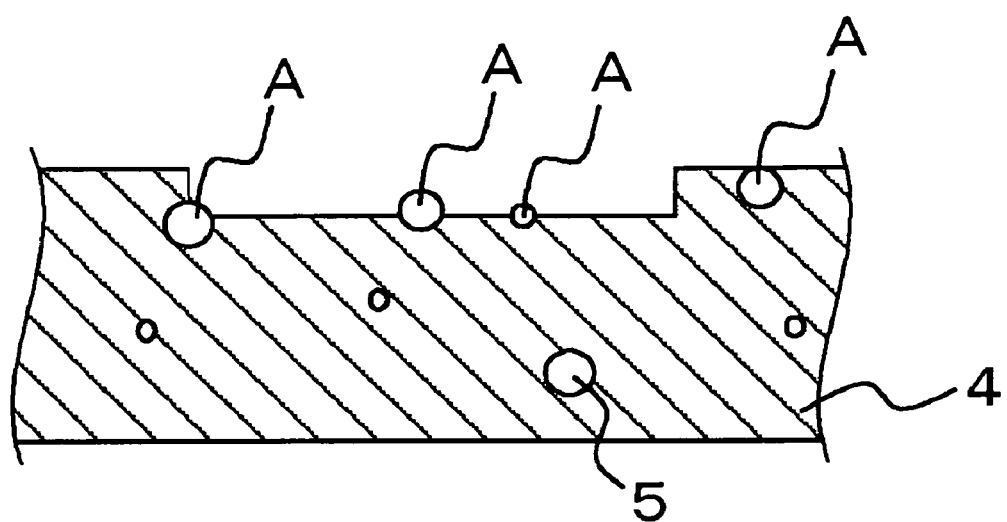
FIG. 7 is a view schematically showing an example of a part of the electronic component according to the embodiments.

FIG. 7 is a view showing an appearance in which a recessed portion is formed on the electronic component in the state of FIG. 5 using a unit, such as dry etching, wet etching, or blasting. When the above unit is used, it is possible to form a state in which the colored particles 5 remain as projections in the recessed portion as shown in the drawing by selecting a condition in which the fraction of the selected colored particles 5 is lowered. Even in the electronic component in the present drawing, it becomes possible to observe colored particles 5 that could not be observed in the state of FIG. 5. That is, the number of dots composing dotted pattern on the surfaces of the electronic component is increased by forming a recessed portion.

Figure 8:
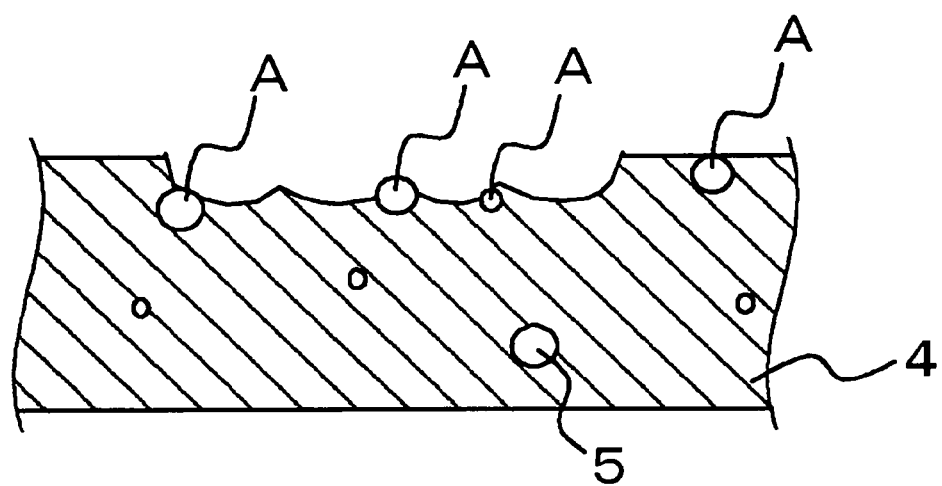
FIG. 8 is a view schematically showing an example of a part of the electronic component according to the embodiments.

FIG. 8 is a view showing an appearance in which a recessed portion is formed on the electronic component in the state of FIG. 5 by scanning a laser in a parallel manner. Here, the drawing is a cross-sectional view perpendicular to the scanning direction. Since the area of the laser irradiation is relatively small, a desired recessed portion may be formed by performing laser irradiation plural times. Meanwhile, when the above unit is used, it is possible to form a state in which the colored particles 5 remain as projections in the recessed portion as shown in the drawing by adjusting the selection rate. In addition, it is also possible to adjust the depth of the recessed portion by changing the speed or the number of times of scanning. Even in the electronic component in the present drawing, it becomes possible to observe colored particles 5 that could not be observed in the state of FIG. 5. That is, the number of dots composing dotted pattern on the surfaces of the electronic component is increased by forming a recessed portion.

In the cases of the electronic components shown in FIGS. 6 to 8, it is possible to obtain different photographing information (authentication patterns) by changing the angle at which dotted pattern are observed, for example, the angle at which dotted pattern are photographed, and therefore the authentication pattern is preferable for use in which high authentication properties or counterfeit obstacles are required.

Meanwhile, the recessed portion may be filled with a transparent resin. By doing so, it is possible to protect the authentication pattern using the transparent resin filling the recessed portion. In addition, the transparent resin filling the recessed portion may be formed into a predetermined protrusion shape so as to act as a lens for observing the authentication pattern. By doing so, the visibility of the authentication pattern is improved, which is preferable.

<Embodiment 3>

While the electronic component of Embodiment 1 forms an authentication pattern (dotted pattern) using a part of the existing components provided in the electronic component, such as the sealing section 3 composed of a sealing material that is used to seal the semiconductor chips 2, the electronic component of the present embodiment has a difference of having an authentication pattern (dotted pattern) attached afterward to an arbitrary location in the electronic component.

First of all, the method of manufacturing the electronic component of the embodiment will be described using the flow chart in FIG. 9.

Figure 9:
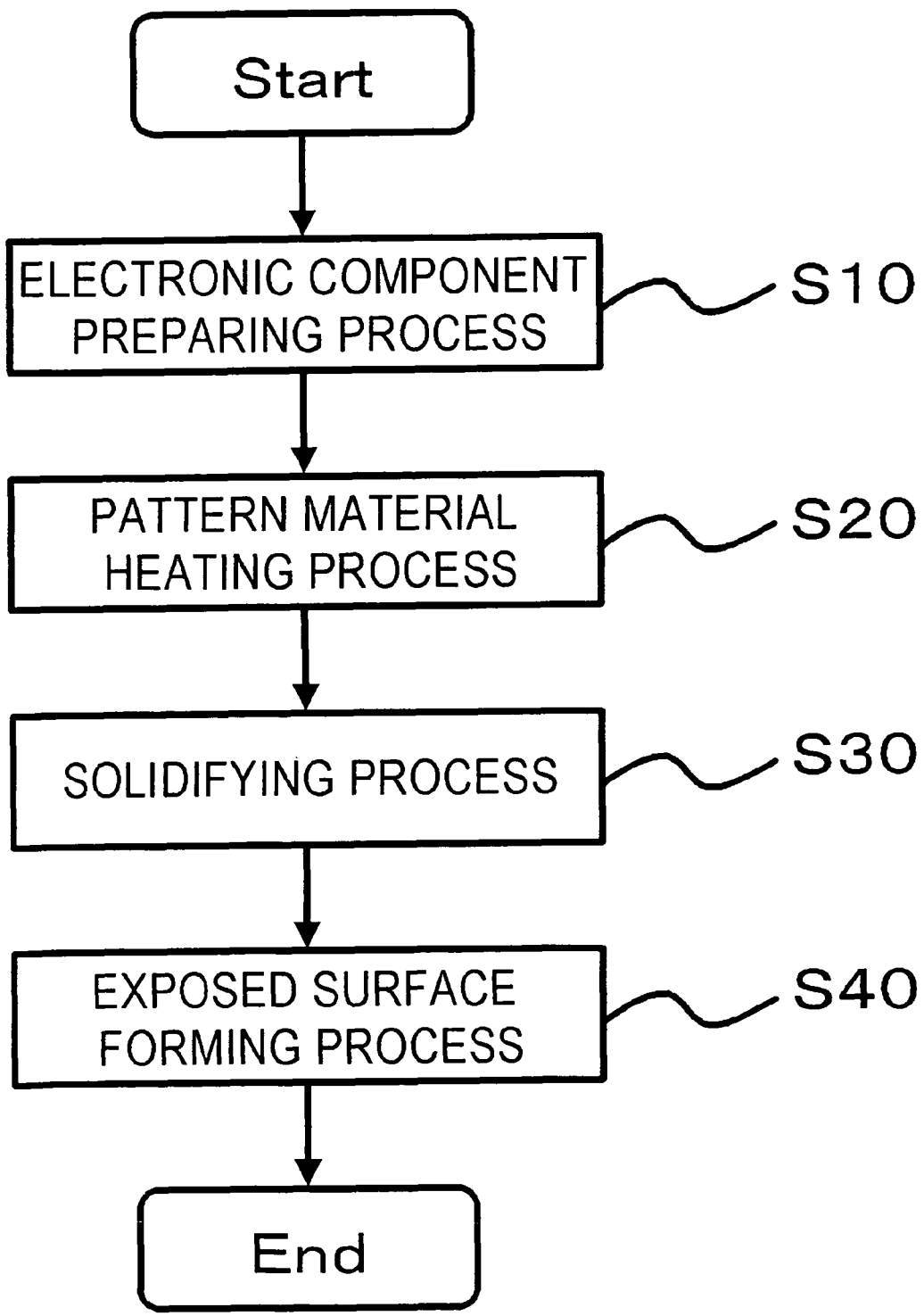
FIG. 9 is a flow chart showing an example of the method of manufacturing an electronic component according to the embodiments.

As shown in FIG. 9, the method of manufacturing the electronic component of the embodiment includes an electronic component preparing process S10, a pattern material heating process S20, and a solidifying process S30. Furthermore, the method may further include an exposed surface forming process S40.

In the electronic component preparing process S10, an electronic component is prepared. The type of the electronic component is not particularly limited, and any type of electronic components may be prepared.

In the pattern material heating process S20, a pattern material including a base resin which will act as the base of an authentication pattern and colored particles 5 is heated. The colored particles 5 have the same configuration as the colored particles 5 as described in Embodiment 1. The colored particles 5 have a hue that can be identified in the pattern material. Meanwhile, the pattern material may have, for example, the same configuration as the sealing material as described in Embodiment 1. The heating in the present process is performed in a condition in which the base resin is melted, but the colored particles 5 are not melted. With regard to such a condition, it is possible to use the same condition as the condition as described in the sealing material heating process S20 for Embodiment 1.

The solidifying process S30 is performed after the pattern material heating process S20, in which the heated and thus melted substance is flowed and solidified on the electronic component. For example, a predetermined amount of the molten substance is flowed in using, for example, a dispensing nozzle and then solidified at a predetermined location on the electronic component. Here, the location on the electronic component where the molten substance is flowed in is a design matter. For example, the electronic component prepared in the electronic component preparing process S10 has a recessed portion formed on the exposed surface, and the molten substance may be flowed into the recessed portion.

The exposed surface forming process S40 is performed after the solidifying process S30, in which the exposed surfaces of a solidified substance of the molten substance are removed, and second exposed surfaces composed of the solidified substance are formed. Since the present process is the same as the exposed surface forming process S40 as described in Embodiment 1, the process will not be described herein.

Meanwhile, the method may further include a process in which the second exposed surfaces are selectively removed, and protrusions and recesses are formed on the second exposed surfaces after the exposed surface forming process S40. The process can be realized by a unit in which a laser is scanned on predetermined locations on the second exposed surfaces, or the like. The process can also be performed after the solidifying process S30. In such a case, it is desirable not to perform the exposed surface forming process S40.

According to the method of manufacturing the electronic component of the embodiment, it becomes possible to attach an authentication pattern (dotted pattern) having the actions and effects as described in Embodiment 1 to all electronic components.

Here, as for reference, an application of the embodiment will be described using FIGS. 10 to 12.

Figure 12:
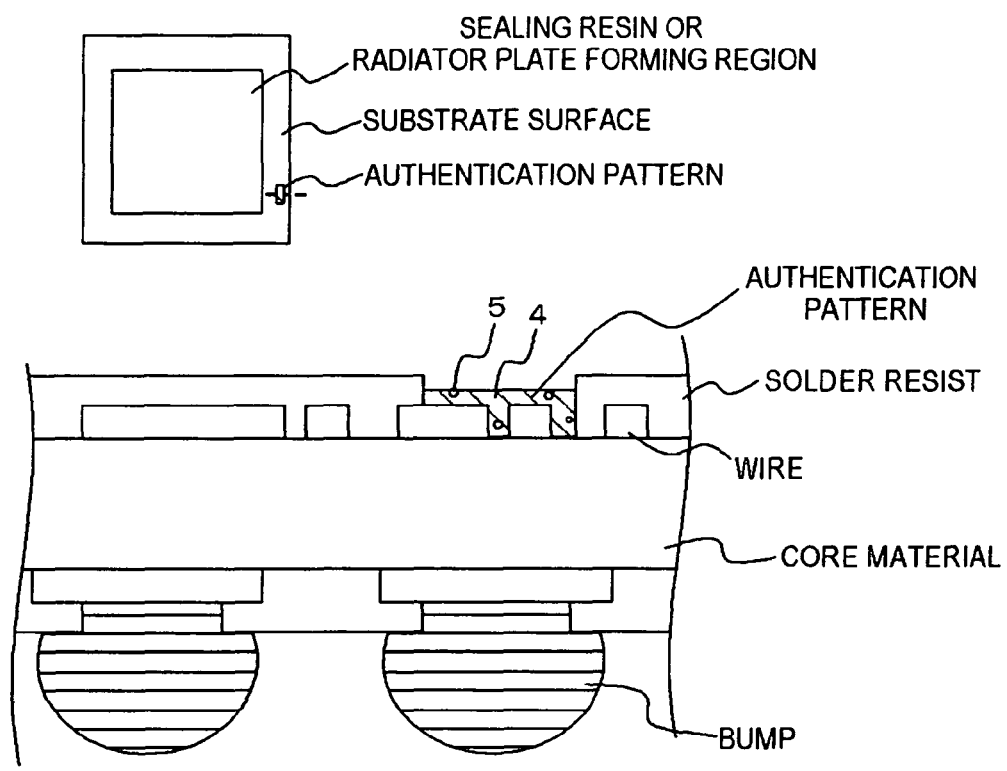
FIG. 12 is a view schematically showing an example of the electronic component according to the embodiments.

FIG. 12 shows an object in which a part of the SR layer in the substrate is opened, and a pattern material is flowed into the opening, thereby forming an authentication pattern. In the drawing, the top one is a schematic plan view, and the bottom one is a schematic cross-sectional view of the location indicated by a dotted line in the schematic plan view. The opening is formed in the substrate manufacturing process. Meanwhile, the timing of flowing the pattern material in the opening is not particularly limited, and thus the pattern material may be flowed in the substrate manufacturing process or the semiconductor manufacturing process. Meanwhile, by forming a pattern before chips are mounted, it is possible to use the pattern for connecting the substrate and the chips in the same individual product.

A unit which flows in the pattern material is not particularly limited, and thus it is possible to use a unit, for example, supply from a nozzle, printing, or scanning after printing. Meanwhile, since characteristics required for the pattern material is extremely loose compared to characteristics required for the sealing material, it is possible to use a thermoplastic resin or a base resin other than black. Meanwhile, it is also possible to employ a configuration having no wire in the drawing. In the case of the configuration in the drawing, since the structure composed of the pattern material also acts as a wire protective layer so that temper properties (the function is also destroyed at the same time) are improved. In addition, by using a base resin having a mechanical strength higher than solder resist, it is possible to obtain an effect in which the SR layer is also destroyed at the same time when removal of the authentication resin is attempted.

Figure 10:
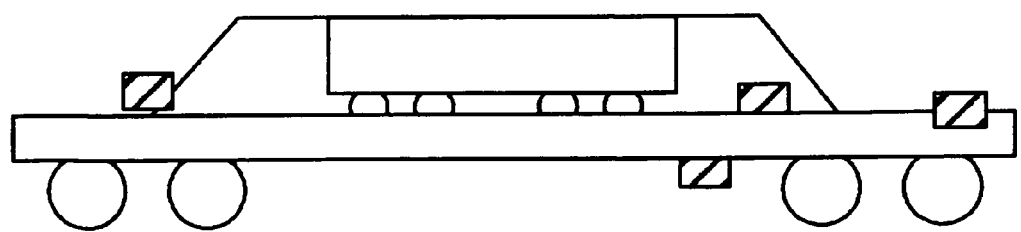
FIG. 10 is a view schematically showing an example of the electronic component according to the embodiments.

FIG. 10 schematically shows a flip chip ball grid array (FCBGA). According to the embodiment, it is possible to flow and solidify the molten substance in an arbitrary location on the FCBGA, for example, locations shown by diagonal hatching (a radiator plate or the like on the substrate) in the drawing, in the solidifying process S30, thereby forming an authentication pattern (dotted pattern).

Figure 11:
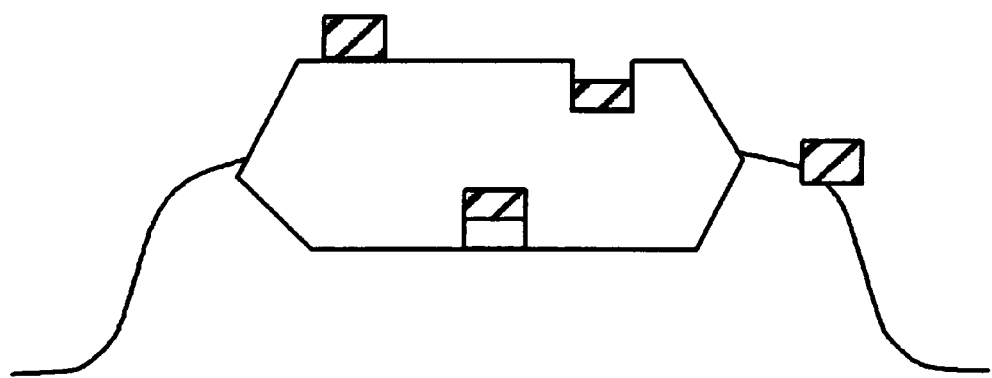
FIG. 11 is a view schematically showing an example of the electronic component according to the embodiments.

In addition, as shown in FIG. 11, an authentication pattern (dotted pattern) may be formed by flowing and solidifying the molten substance on the top of the sealing section that seals the semiconductor chips or on the top of the lead in the solidifying process S30. Additionally, as shown in FIG. 11, it is possible to form a recessed portion at a predetermined location (in the case of FIG. 11, at the exposed surface of the sealing section) on the electronic component, and then, in the solidifying process S30, to flow and solidify the molten substance in the recessed portion, thereby forming an authentication pattern (dotted pattern). By doing so, regions composing the authentication patterns become clear. In addition, the property of the authentication pattern to be stably maintained is improved. That is, when an authentication pattern is formed by flowing and solidifying the molten substance in the flat surface of the electronic component, the solidified substance forms a protrusion portion, and thus it is likely that a problem of peeling off or the like occurs; however, when an authentication pattern is formed in a recessed portion, it is not likely that such a problem occurs.

<Embodiment 4>

The authentication pattern may be the random dispersion of particles obtained by natural fluctuation or dotted pattern formed on an electronic component in a manner in which the colored particles 5 are dropped on the surface of a sealing resin which is yet to be cured or on a mold which comes into contact with the surface of a sealing resin, and then the sealing material is flowed and solidified in the mold. In this case, since coloring particles are dispersed on the surface at a high density, it is possible to minimize the variation in the characteristics (retroflexion behaviors) of the entire electronic component.

Meanwhile, in the above embodiments, the following description has been made regarding the invention.

An electronic component, including
a base section including a resin,
colored particles which have a hue that can be identified in the base section and have a particle diameter of equal to or larger than 10 μm and equal to or smaller than 100 μm,
in which the colored particles are dispersed so as to form dotted pattern on at least a part of the surfaces of the base section, and the density of the dotted pattern is equal to or larger than 0.05 particles/mm$^2$ and equal to or smaller than 3 particles/mm$^2$.

It is apparent that the present invention is not limited to the above embodiment, and may be modified and changed without departing from the scope and spirit of the invention.

What is claimed is:

1. An electronic component having an authentication pattern formed over exposed surfaces,
    wherein the authentication pattern includes a base section including a resin and colored particles having a hue that can be identified in the base section, and the colored particles are dispersed so as to form dotted pattern in the base section.
2. The electronic component according to claim 1,
    wherein the particle diameter of each of the colored particles is equal to or larger than 1 μm and equal to or smaller than 100 μm.
3. The electronic component according to claim 1,
    wherein the colored particles are present in the authentication pattern at a density of equal to or larger than 0.05 particles/mm$^2$ and equal to or smaller than 3 particles/mm$^2$.
4. The electronic component according to claim 1, having a structure in which semiconductor chips are sealed with a sealing material including the resin composing the base section and the colored particles,
    wherein the authentication pattern is formed over sealed surfaces composed of the sealing material.
5. The electronic component according to claim 4,
    wherein an alignment mark is attached to surfaces formed of the sealing material.
6. The electronic component according to claim 1,
    wherein a recessed portion is formed in the electronic component, and the authentication pattern is formed in the recessed portion.
7. The electronic component according to claim 1,
    wherein the colored particles include two or more colored particles having different hues.
8. The electronic component according to claim 1,
    wherein protrusions and recesses are formed in the authentication pattern.
9. The electronic component according to claim 1,
    wherein the visible light reflectivity of the colored particle is larger than the visible light reflectivity of the base section.
10. The electronic component according to claim 1,
    wherein the surface of the authentication pattern is polished.

* * * * *